(12) United States Patent
Watanabe

(10) Patent No.: US 9,055,676 B2
(45) Date of Patent: Jun. 9, 2015

(54) DIFFERENTIAL SIGNAL TRANSMISSION CIRCUIT AND METHOD FOR MANUFACTURING SAME

(71) Applicant: FUJIKURA LTD., Tokyo (JP)

(72) Inventor: Hirohito Watanabe, Sakura (JP)

(73) Assignee: FUJIKURA LTD., Tokyo (JP)

( * ) Notice: Subject to any disclaimer, the term of this patent is extended or adjusted under 35 U.S.C. 154(b) by 101 days.

(21) Appl. No.: 13/773,182

(22) Filed: Feb. 21, 2013

(65) Prior Publication Data

US 2013/0161077 A1 Jun. 27, 2013

Related U.S. Application Data

(63) Continuation of application No. PCT/JP2011/061388, filed on May 18, 2011.

(30) Foreign Application Priority Data

Aug. 30, 2010 (JP) .................. 2010-192537

(51) Int. Cl.
| | |
|---|---|
| H05K 1/11 | (2006.01) |
| H05K 3/02 | (2006.01) |
| H05K 3/10 | (2006.01) |
| H05K 1/02 | (2006.01) |
| H05K 1/03 | (2006.01) |

(52) U.S. Cl.
CPC ............ *H05K 1/0245* (2013.01); *H05K 1/0277* (2013.01); *H05K 3/10* (2013.01); *Y10T 29/49155* (2015.01); *H05K 1/0393* (2013.01)

(58) Field of Classification Search
CPC .............. H05K 1/0219; H05K 1/0245; H05K 14/0277; H05K 3/10

USPC ...................... 174/255–261; 29/846
See application file for complete search history.

(56) References Cited

U.S. PATENT DOCUMENTS

| | | | |
|---|---|---|---|
| 6,867,668 B1 * | 3/2005 | Dagostino et al. ............ 333/246 |
| 8,017,874 B2 | 9/2011 | Honjo et al. |

(Continued)

FOREIGN PATENT DOCUMENTS

| | | |
|---|---|---|
| CN | 101370351 A | 2/2009 |
| JP | 2000-323525 A | 11/2000 |

(Continued)

OTHER PUBLICATIONS

International Search Report for PCT/JP2011/061388, mailing date of Jun. 21, 2011.

(Continued)

*Primary Examiner* — Jeremy C Norris
(74) *Attorney, Agent, or Firm* — Westerman, Hattori, Daniels & Adrian, LLP

(57) ABSTRACT

A differential signal transmission circuit comprises: an insulating layer; two signal lines provided in parallel on one surface of the insulating layer; a GND line formed on each of outer sides of the two signal lines on the one surface of the insulating layer; and a wiring line layer formed on the other surface of the insulating layer, the differential signal transmission circuit being configured by a double-sided flexible printed circuit board, the signal lines, the GND line and the wiring line layer being formed by a semi-additive method on the insulating layer, and the signal line and the GND line being formed such that a distance S between the two signal lines is greater than a distance D between the signal line and the GND line.

6 Claims, 5 Drawing Sheets

(56) References Cited

U.S. PATENT DOCUMENTS

| 8,022,309 B2 | 9/2011 | Pai et al. |
| 2009/0218126 A1 | 9/2009 | Honjo et al. |

FOREIGN PATENT DOCUMENTS

| JP | 2005-123520 A | 5/2005 |
| JP | 2006-100384 A | 4/2006 |
| JP | 2007-149737 A | 6/2007 |
| JP | 2009-206379 A | 9/2009 |
| JP | 2009-246092 A | 10/2009 |
| JP | 2010-128700 A | 6/2010 |

OTHER PUBLICATIONS

Chinese Office Action dated Feb. 2, 2015, issued in corresponding CN Patent Application No. 201180042145.2 (6 pages).

* cited by examiner

DIFFERENTIAL SIGNAL TRANSMISSION CIRCUIT AND METHOD FOR MANUFACTURING SAME

CROSS REFERENCE TO RELATED APPLICATIONS

This application is a continuation application of PCT application No. PCT/JP2011/061388, filed on May 18, 2011, which is based on and claims the benefit of priority from prior Japanese Patent Application No. 2010-192537, filed on Aug. 30, 2010, the entire contents of which are incorporated herein by reference.

BACKGROUND OF THE INVENTION

1. Field of the Invention

The present invention relates to a differential signal transmission circuit formed on an insulating layer of a double-sided flexible printed circuit board by a semi-additive method, and a method for manufacturing the same.

2. Description of the Related Art

In recent years, differential signal transmission technology that transfers data using a pair of signal lines has been widely employed as a high-speed signal transmission technology. Differential signal transmission is configured to transmit signals having phases opposite to each other, by two signal lines configuring a differential signal transmission circuit, hence has excellent noise immunity compared to single-end transmission, and can transmit data at high speed with a small signal amplitude.

Such differential signal transmission has an on-circuit characteristic impedance (differential impedance) Zdiff defined according to various standards. This differential impedance Zdiff is obtained by various elements, for example: distance between the two signal lines or circuit width; distance between the signal lines and a ground (GND) line; distance between a circuit formed on a surface on an opposite side to the signal lines sandwiching an insulating layer, and the signal lines; and so on.

Moreover, in differential signal transmission, in order to further increase noise immunity and so on while keeping pace with, for example, miniaturization of portable information terminals, increase in amounts of data transmitted, and so on, it is generally considered desirable that the two signal lines configuring the differential signal transmission circuit are disposed close to each other.

This is because disposing the two signal lines close to each other allows configuration of a closed system where many of magnetic field lines generated by a current flowing in one of the signal lines terminate in the other of the signal lines, whereby tolerance to noise from external can be increased. Moreover, in this case, thickness of the two signal lines is preferably made as constant as possible. This is because, if thickness of the two signal lines differs, symmetry of a transmission path breaks down and a differential signal of the two signal lines is converted to common mode noise, whereby radiation of electromagnetic waves or malfunction occur.

Now, in the case of trying to form a differential signal transmission circuit on a flexible printed circuit board, there is a structure where thickness of a base film (insulating layer) is extremely thin compared to thickness of a base material in a rigid substrate, hence capacitance C due to coupling between conductors formed on both of front and reverse surfaces sandwiching the insulating layer increases, whereby the differential impedance Zdiff lowers.

As a result, in order to secure a differential impedance Zdiff defined according to a standard, it is necessary to set design conditions such that the differential impedance Zdiff increases more than for design conditions in a rigid substrate. The following methods exist for increasing the differential impedance Zdiff in a differential signal transmission circuit in a flexible printed circuit board.

Namely, any of the methods of: (1) narrowing a line width of the two signal lines; (2) widening a spacing of the two signal lines; and (3) widening a distance between the signal line and the GND line.

At the same time, in recent years, this kind of differential signal transmission circuit has increasingly come to be formed by a semi-additive method. The semi-additive method is a method where, for example, having formed a seed layer, by non-electrolytic plating, on a base film that has undergone processing to roughen a surface of the base film, a plating resist is formed to perform an electrolytic plating, and the plating resist and the seed layer are removed to form a circuit pattern. The semi-additive method is widely employed when forming a minute circuit with high precision.

However, there is a problem that when the semi-additive method is employed, a variation in current density occurs due to a difference in width of wiring lines formed in a process of a plating layer growing on the seed layer, and there is a tendency for the plating to be formed thickly in broad places of the wiring lines and thinly in narrow places of the wiring lines, giving rise to variation in thickness of a wiring line layer.

In order to try to avoid such a problem, a method for forming a differential signal transmission circuit configured to have a circuit thickness which is constant, and configured to have a dummy pattern formed in a close vicinity of the circuit pattern configuring the differential signal transmission circuit to thereby suppress variation in current density during electrolytic plating, is known (refer to, for example, Examined Japanese Patent Application Publication No. JP 2000-323525 A and Unexamined Japanese Patent Application Publication No. JP 2007-149737 A).

SUMMARY OF THE INVENTION

However, in the conventional method disclosed in the above-mentioned JP 2000-323525 A and JP 2007-149737 A, it is necessary to form a dummy pattern in a close vicinity of the circuit pattern. This causes a large restriction to be placed on circuit design and also results in occurrence of the following problem, namely that the more the circuit pattern is miniaturized as in above-described (1), the more difficult it becomes to suppress variation in circuit thickness in the semi-additive method, even if the dummy pattern is formed.

Moreover, in the semi-additive method, there is a tendency that the more a signal line is separated from a GND (ground) line which has a broad circuit width, the smaller current density becomes and the thinner a film thickness becomes, hence the greater the variation in the film thickness becomes. Therefore, a method that separates the signal line from the GND line as in above-described (3) ends up further and further increasing the tendency to variation in circuit thickness of the signal line.

Furthermore, in the case of above-described (2), coupling between the signal lines weakens thereby lowering resistance to noise.

As described above, in manufacture of a differential signal transmission circuit in a flexible printed circuit board by a semi-additive method, there is a problem that suppressing variation in current density concentrated in the signal line during electrolytic plating to stabilize circuit thickness and thereby secure a required differential impedance characteristic or noise immunity is extremely difficult.

The present invention was made in view of the above-described problems, and has an object of providing a differential signal transmission circuit formed on a double-sided flexible printed circuit board by a semi-additive method, the differential signal transmission circuit enabling a circuit thickness to be made constant and enabling a desired differential impedance characteristic and noise immunity to be secured, and a method for manufacturing the same.

A differential signal transmission circuit according to an embodiment of the present invention comprises: an insulating layer; two signal lines provided in parallel on one surface of the insulating layer; a GND line formed on each of outer sides of the two signal lines on the one surface of the insulating layer; and a wiring line layer formed on the other surface of the insulating layer, the differential signal transmission circuit being configured by a double-sided flexible printed circuit board, the signal lines, the GND line and the wiring line layer being formed by a semi-additive method on the insulating layer, and the signal line and the GND line being formed such that a distance S between the two signal lines is greater than a distance D between the signal line and the GND line.

The differential signal transmission circuit according to the embodiment of the present invention has the distance S between the signal lines formed to be greater than the distance D between the signal line and the GND line, hence makes it difficult for variation to occur in current density with respect to the signal line during circuit formation by the semi-additive method, thereby enabling circuit thickness to be made constant without employing a dummy pattern. Moreover, since the distance D between the signal line and the GND line is smaller than the distance S between the signal lines, a closed system where magnetic field lines from the signal line terminate in the GND line can be configured, thereby enabling excellent differential impedance characteristics and noise immunity to be secured.

In another embodiment of the present invention, a relationship between the distance S and the distance D preferably satisfies 2D<S.

In yet another embodiment of the present invention, the distance D is, for example, 5 μm~60 μm.

In yet another embodiment of the present invention, the insulating layer is preferably formed with a thickness of 10 μm~30 μm.

In yet another embodiment of the present invention, a difference in thickness of the two signal lines is, for example, 0.8 μm or less.

A method for manufacturing a differential signal transmission circuit according to an embodiment of the present invention, the differential signal transmission circuit being configured by a double-sided flexible printed circuit board and having two signal lines provided in parallel and, on an outer side of the two signal lines, a GND line, formed on one surface of an insulating layer, and having a wiring line layer formed on the other surface of the insulating layer, by a semi-additive method, comprises: forming a seed layer on both surfaces of the insulating layer, the seed layer being conductive; forming a plating resist pattern on the seed layer, such that a distance S between the two signal lines is greater than a distance D between the signal line and the GND line; forming a plating layer on the seed layer where the plating resist is not formed above the seed layer, by electrolytic plating; and removing the plating resist and the seed layer below the plating resist.

The present invention enables a circuit thickness to be made constant and an excellent differential impedance characteristic and noise immunity to be secured in a differential signal transmission circuit formed on a double-sided flexible printed circuit board by a semi-additive method.

DETAILED DESCRIPTION OF THE EMBODIMENTS

Preferred embodiments of a differential signal transmission circuit and a method for manufacturing the same according to the present invention are described in detail below with reference to the accompanying drawings.

Figure 1:
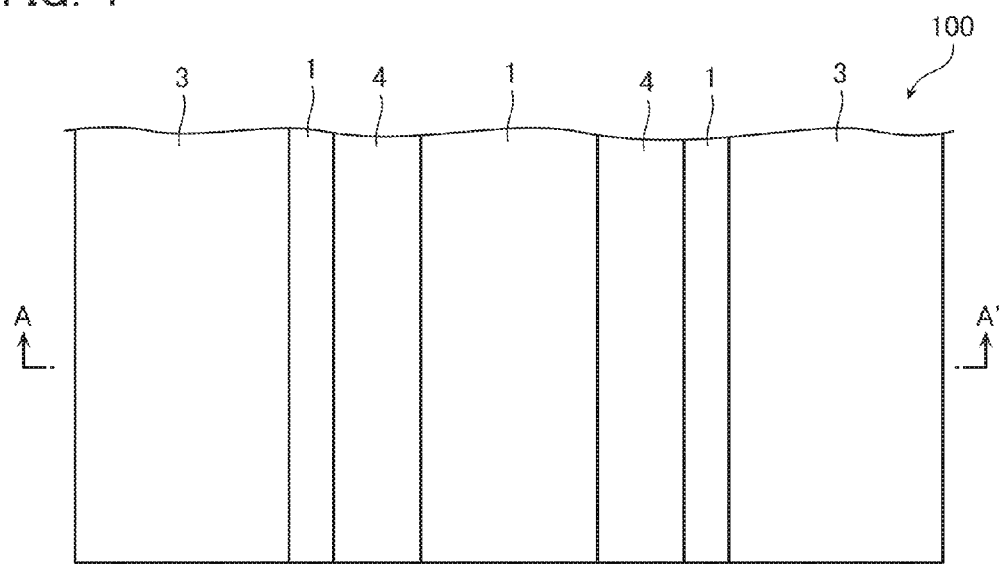
FIG. 1 is a top view of a double-sided flexible printed circuit board on which is formed a differential signal transmission circuit according to an embodiment of the present invention.
Figure 2:
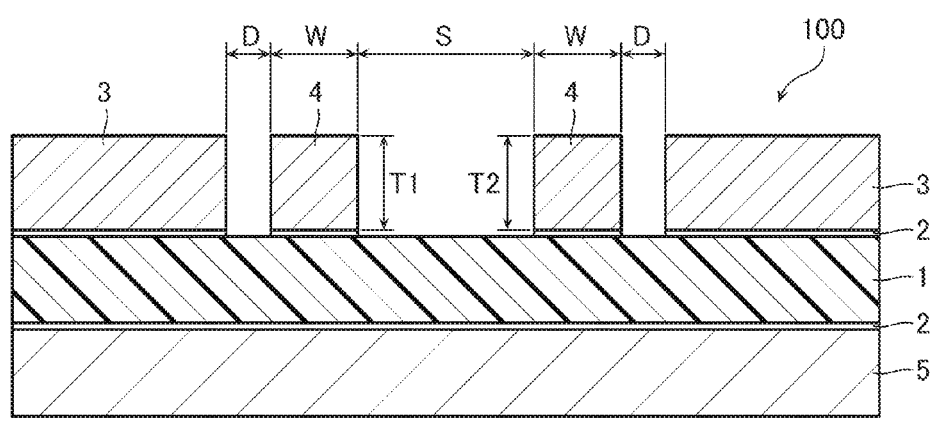
FIG. 2 is a cross-sectional view taken along the line A-A' of FIG. 1.

FIG. 1 is a top view of a double-sided flexible printed circuit board on which is formed a differential signal transmission circuit according to an embodiment of the present invention. FIG. 2 is a cross-sectional view taken along the line A-A' of FIG. 1. As shown in FIGS. 1 and 2, the differential signal transmission circuit according to the present embodiment is formed on the double-sided flexible printed circuit board by a semi-additive method.

That is, the differential signal transmission circuit is formed by a double-sided flexible printed circuit board 100, and configured from: a base film 1 having flexibility; a seed layer 2 formed on both surfaces of this base film 1; a ground (GND) pattern and a signal transmission pattern formed on a side of one surface of the base film 1, the GND pattern configured from a GND line 3, and the signal transmission pattern configured from a pair of signal lines 4; and a GND pattern 5 of solid filling form formed on a side of the other surface of the base film 1. The pair of signal lines 4 are formed in parallel, and the GND line 3 is formed on an outer side of these signal lines 4. The GND pattern 5 may be another wiring line layer.

The base film 1 of the double-sided flexible printed circuit board 100 is configured from an insulating material such as PET, PEN, PI, PA, or a liquid crystal polymer, and so on, and is formed having a thickness of 10 μm~30 μm. In the present embodiment, the base film 1 is formed having a thickness of, for example, 25 μm.

The seed layer 2 is configured from a metal material such as copper stacked by non-electrolytic plating on both surfaces of the base film 1, the base film 1 having undergone processing to roughen the surfaces. Moreover, the seed layer 2 is formed to increase adhesion between the base film 1 and the GND line 3, signal line 4, and so on. In the present embodiment, the seed layer 2 is formed having a thickness of, for example, about 2 μm.

The GND line 3, the signal line 4, and the GND pattern 5 are configured from a conductive material such as copper or aluminum, a conductive macromolecule, or the like, that is formed on the seed layer 2 by electrolytic plating, and are formed having a circuit thickness of, for example, 12 μm. Note that the GND line 3 is formed with a circuit width sufficiently larger than a circuit width W of the signal line 4.

The signal line 4 is formed having a circuit width W of, for example, 60 μm, and such that a difference in circuit thickness T1 and T2 is 0.8 μm or less. In addition, a distance D between the GND line 3 and the signal line 4 is formed to be 5 μm~60 μm, and is here formed to be, for example, 60 μm. Moreover, the pair of signal lines 4 each transmits a differential signal of opposite phase, and regarding a relationship between a distance S between the signal lines 4 and the above-described distance D between the GND line 3 and the signal line 4, the pair of signal lines 4 are formed between the GND pattern configured from a plurality of the GND lines 3 such that $2D < S$.

Specifically, in the differential signal transmission circuit according to the present embodiment, when the distance D between the GND line 3 and the signal line 4 is 60 μm, the pair of signal lines 4 are formed between the plurality of the GND lines 3 such that the distance S between the signal lines 4 is greater than 120 μm. Next, manufacturing processes in a method for manufacturing this differential signal transmission circuit are described.

Figure 3:
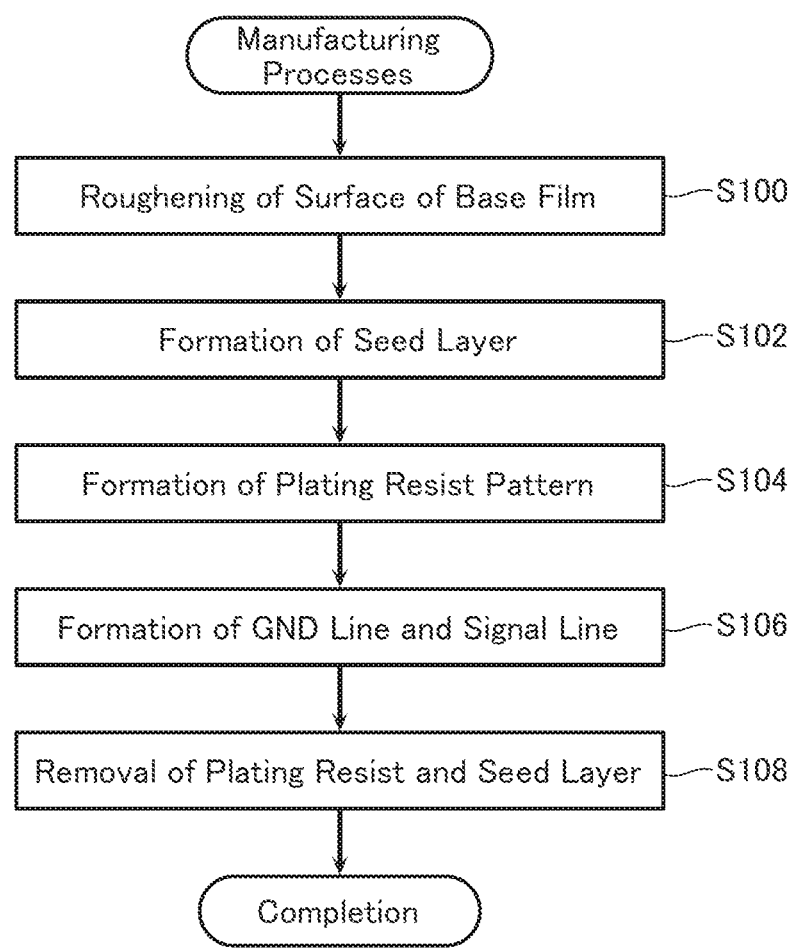
FIG. 3 is a flowchart showing a method for manufacturing a differential signal transmission circuit according to an embodiment of the present invention.
Figure 5:
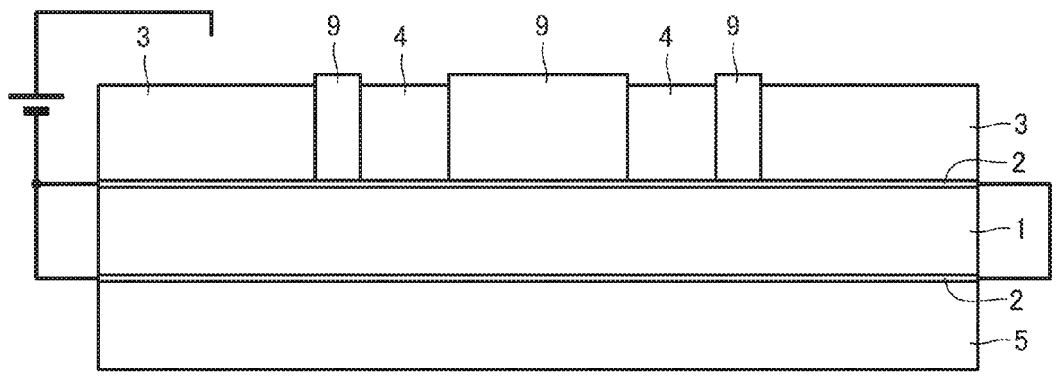
FIG. 5 is a view for explaining part of same method for manufacturing.
Figure 6:
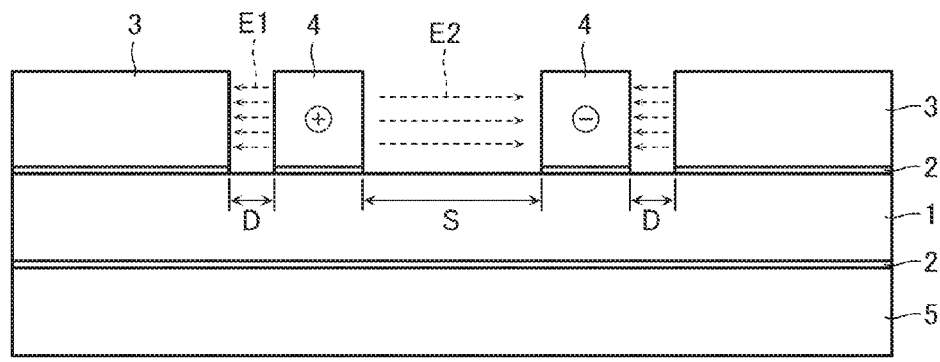
FIG. 6 is an electromagnetic field distribution diagram of a close vicinity of a signal line and a GND line in the differential signal transmission circuit according to the embodiment of the present invention.
Figure 7:
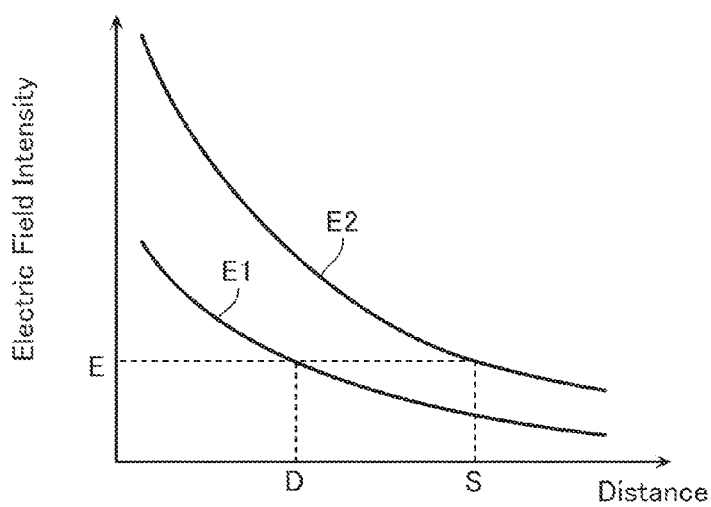
FIG. 7 is a view showing a relationship between a distance between the GND line and the signal line and an electric field intensity, and a distance between the signal lines and an electric field intensity, in same differential signal transmission circuit.

FIG. 3 is a flowchart showing a method for manufacturing a differential signal transmission circuit according to an embodiment of the present invention. FIGS. 4A, 4B, 4C, 4D, and 4E are process diagrams showing same method for manufacturing. FIG. 5 is a view for explaining part of same method for manufacturing. FIG. 6 is an electromagnetic field distribution diagram of a close vicinity of the signal line and the GND line in the differential signal transmission circuit. FIG. 7 is a view showing a relationship between the distance between the GND line and the signal line and an electric field intensity, and the distance between the signal lines and an electric field intensity, in the differential signal transmission circuit.

Figure 4A:
FIG. 4A is a process diagram showing same method for manufacturing.
Figure 4B:
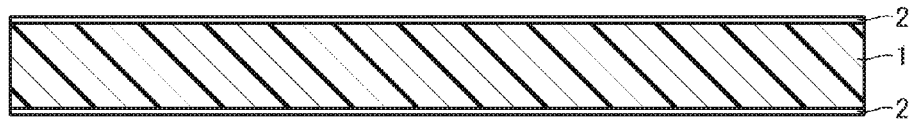
FIG. 4B is a process diagram showing same method for manufacturing.

In the manufacturing processes of the differential signal transmission circuit, first, as shown in FIGS. 3 and 4A, the base film 1 that has been prepared with a certain thickness has its surface roughened (step S100), and then, as shown in FIG. 4B, the seed layer 2 is formed on an entire surface of this roughening-processed base film 1 by non-electrolytic plating (step S102).

Figure 4C:
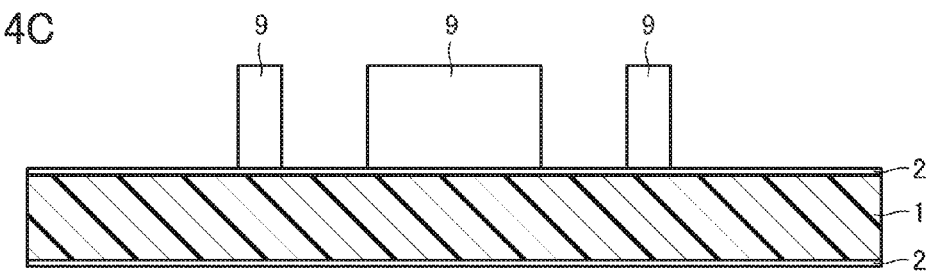
FIG. 4C is a process diagram showing same method for manufacturing.
Figure 4D:
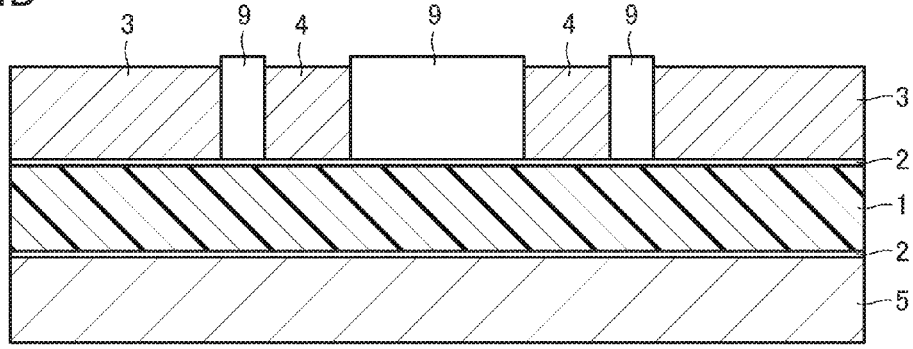
FIG. 4D is a process diagram showing same method for manufacturing.

Next, as shown in FIG. 4C, a resist pattern configured from a plating resist 9 for forming, respectively, the GND pattern and the signal transmission pattern configured from the GND line 3 and the signal line 4, is formed on the seed layer 2 on one surface of the base film 1 (step S104), and, as shown in FIG. 4D, electrolytic plating is performed to form the GND line 3, the signal line 4, and the GND pattern 5 on the seed layer 2 on both surfaces of the base film 1 other than where the plating resist is present (step S106).

Figure 4E:
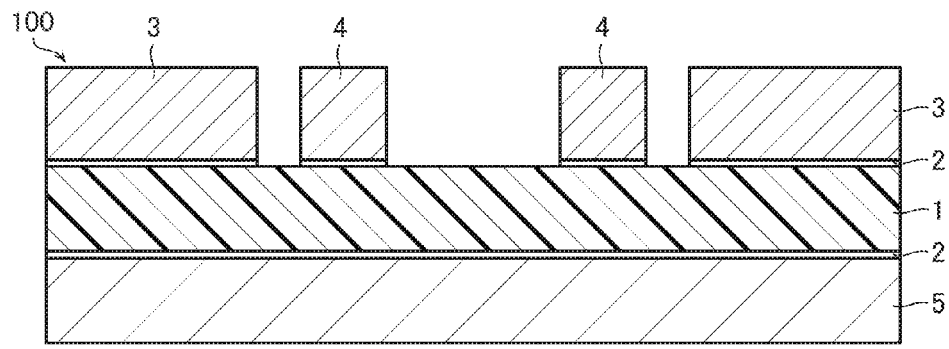
FIG. 4E is a process diagram showing same method for manufacturing.

Finally, as shown in FIG. 4E, wet etching is performed to remove the plating resist 9 and the seed layer 2 below the plating resist 9 (step S108), whereby the differential signal transmission circuit is formed in the double-sided flexible printed circuit board 100, and the series of manufacturing processes according to the present flowchart are completed. Now, during formation of the GND line 3, the signal line 4, and the GND pattern 5 in the above-described step S106, electrolytic plating is performed, but, as mentioned above, the signal line 4 is formed close to the GND line 3, and, moreover, is formed such that the distance D between the GND line 3 and the signal line 4 is within a range of 5 μm~60 μm.

Therefore, as shown in FIG. 5, an electrical resistance value of the seed layer 2 located directly below the plating resist 9 between the GND line 3 and the signal line 4 can be reduced, thereby making it easier for a current I to flow uniformly from a GND line 3 side, where plating area is large and it is easy for the current I to flow (be concentrated) during electrolytic plating, to a signal line 4 side. As a result, supply of the current I to the signal line 4 during electrolytic plating becomes stable, whereby variation in growth of the plating can be suppressed, hence the signal line 4 can be formed in a state where the difference between the circuit thickness T1 and T2 of the signal line 4 is a narrow margin of 0.8 μm or less.

This allows a common mode component in the two signal lines 4 to be suppressed and, as a result of the GND line 3 and the signal line 4 being formed close to each other, allows coupling between the GND line 3 and the signal line 4 to be increased. Therefore, causing the GND line 3 to act as a shield allows adoption of a structure in which it is difficult for noise to be emitted from the signal line 4 to external. Since this amounts also to effects of noise from external being suppressed, the differential signal transmission circuit according to the present embodiment is enabled to secure good noise immunity.

Moreover, from a viewpoint of electric field intensity, the following may be understood. That is, as shown in FIG. 6, when it is assumed that a distance and an electric field between the GND line 3 and the signal line 4 are D and E1, respectively, a distance and an electric field between the signal line 4 (+) and the signal line 4 (−) are S and E2, respectively, and a potential difference between the signal line 4 (+) and the signal line 4 (−) is V, then $E1 = (\frac{1}{2})V/D$ and $E2 = V/S$, hence, as shown in FIG. 7, when $2D = S$, $E1 = E2$, and if $2D < S$, $E1 > E2$. Therefore, as may be clearly understood also from FIG. 7, in order to make the electric field E1 between each of the signal line 4 and the GND line 3 larger than the electric field E2 between the signal lines 4, it is desirable that the distance S > the distance 2D.

Note that as mentioned above, it has been conventional practice to form the GND line and the signal line by making the distance S between the signal lines 4 as small as possible and making the distance D between the signal line 4 and the GND line 3 as large as possible (that is, make the distance S<the distance D), or form the GND line and the signal line having these distances S and D set to a smallest possible equal interval.

The reason for this was to increase interline coupling of the signal lines to try to improve noise immunity, and to suppress as much as possible variation of plating thickness during electrolytic plating to try to stabilize differential characteristics. However, as mentioned above, the differential impedance Zdiff of the signal line 4 fluctuates according to elements such as the distance between the signal line 4 and the GND pattern 5 on the other surface of the base film 1, besides the circuit width W of the signal line 4, hence there was an invalid reason for simply narrowing the distance S between the signal lines 4.

In contrast, the differential signal transmission circuit according to the present embodiment adopts a configuration where, having considered a thickness of the base film 1 in the double-sided flexible printed circuit board 100, the distance D between the GND line 3 and the signal line 4 is specified in a certain range, and the distance S between the signal lines 4 determined based on this distance D. As a result, it was found that in circuit formation by the semi-additive method, circuit thickness can be made constant while securing as large as possible a circuit width W of the signal line 4 matching the required differential impedance Zdiff. This has made it possible to secure excellent differential impedance characteristics and noise immunity.

Figure 8:
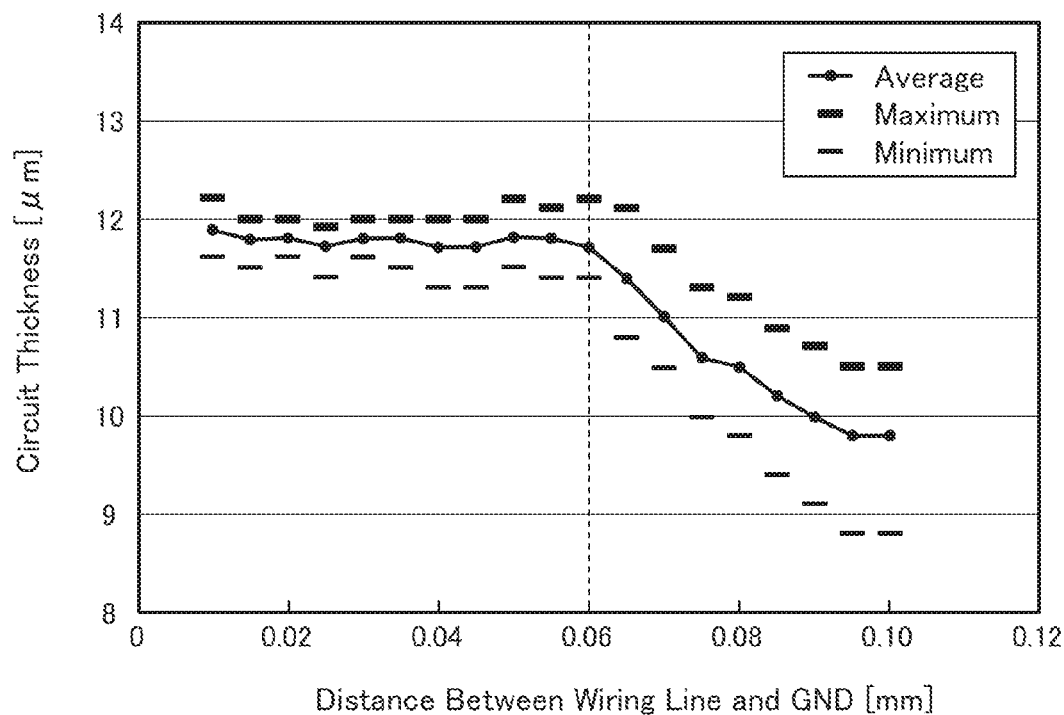
FIG. 8 is a view showing a relationship between circuit thickness and the distance between the signal line and the GND line in an example of same differential signal transmission circuit.

The differential signal transmission circuit is specifically described below through an example. FIG. 8 is a view showing a relationship between circuit thickness and the distance between the signal line and the GND line in an example of the differential signal transmission circuit. In addition, FIG. 9 is a view showing a relationship between a difference in circuit thickness of the signal line and the distance between the signal line and the GND line in the example of the differential signal transmission circuit.

In the present example, samples of the differential signal transmission circuit were made by, for example, setting the circuit width W of the signal line 4 to 60 μm, setting the distance S between the signal lines 4 likewise to 60 μm, and setting the distance D between the GND line 3 and the signal line 4 at intervals of 5 μm from 5 μm to 100 μm, and the relationship between the distance D and the circuit thickness T1 and T2 investigated. Note that each of the samples was prepared with plating conditions matched such that circuit thickness of the GND line 3 was 12 μm±1 μm.

First, as shown in FIG. 8, for each 10 units of the samples, a cross-sectional measurement was performed, and an average value, maximum value and minimum value of the circuit thickness T1 and T2 of the signal line 4 was plotted. As a result, it became clear that taking as a dividing line the case where the distance D between the GND line 3 and the signal line 4 is 60 μm, if the distance D becomes larger than that 60 μm, the average value of the circuit thickness becomes smaller and variation in circuit thickness increases. It is clear that in this case, if the distance D is 60 μm or less, the circuit thickness T1 and T2 of the signal line 4 is formed stably at about 12 μm.

Figure 9:
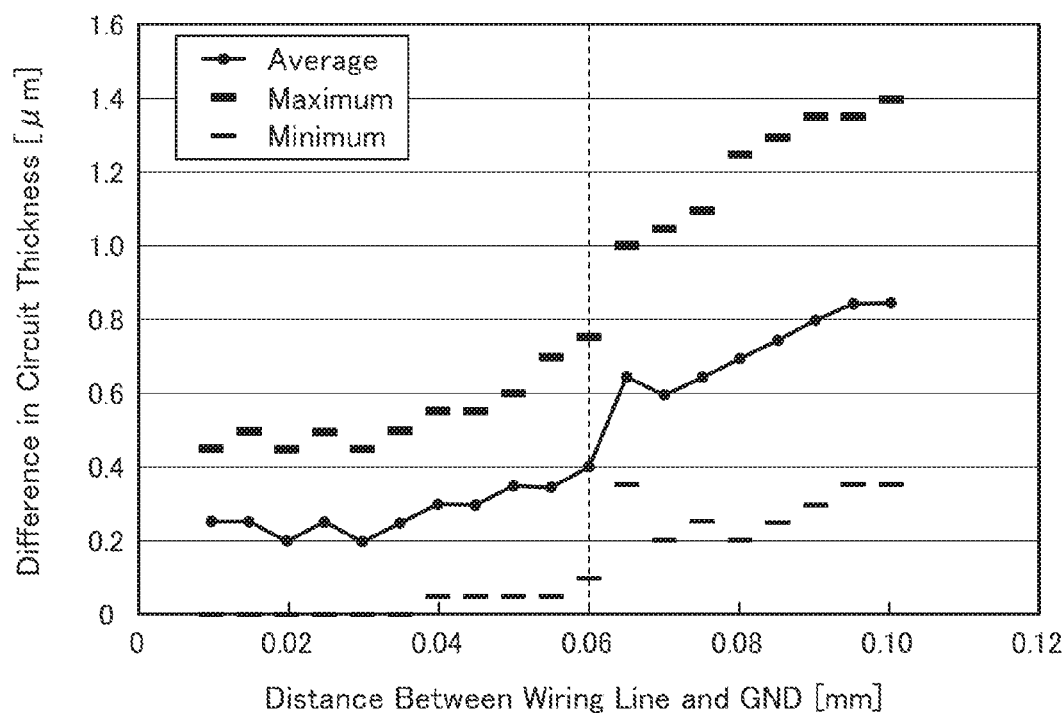
FIG. 9 is a view showing a relationship between a difference in circuit thickness of the signal line and the distance between the signal line and the GND line in the example of same differential signal transmission circuit.

Moreover, as shown in FIG. 9, a cross-sectional measurement was performed similarly to the case shown in FIG. 8, and an average value, maximum value and minimum value of the difference in circuit thickness T1 and T2 of the two signal lines 4 was plotted. As a result, it became clear that regarding also the difference in thickness T1 and T2 of the two signal lines 4, taking as a dividing line the case where the distance D between the GND line 3 and the signal line 4 is 60 μm, if the distance D becomes larger than that 60 μm, the average value of the difference in circuit thickness becomes larger and variation in circuit thickness also increases. It is clear that in this case, if the distance D is 60 μm or less, the difference in circuit thickness T1 and T2 of the signal line 4 is formed stably at 0.8 μm or less.

The above-described results have made it possible to reduce variation in the circuit thickness T1 and T2 of the signal line 4 by making the distance D between the GND line 3 and the signal line 4 narrower than the distance S between the signal lines 4. As a result, in the differential signal transmission circuit formed by the semi-additive method, the circuit thickness of the signal line 4 can be made constant and control of the differential impedance Zdiff can be easily performed, whereby excellent differential impedance characteristics and noise immunity can be secured.

What is claimed is:

1. A differential signal transmission circuit, comprising:
   an insulating layer;
   two first conductive seed layers in parallel formed on one surface of the insulating layer;
   two signal lines provided in parallel on the first conductive seed layers and having the same pattern as the first conductive seed layers;
   a second conductive seed layer formed on each of outer sides of the first conductive seed layers on the one surface of the insulating layer;
   a GND line formed on each of outer sides of the two signal lines on the second conductive seed layer and having the same pattern as the second conductive seed layer; and
   a wiring line layer formed on the other surface of the insulating layer,
   the differential signal transmission circuit being configured by a double-sided flexible printed circuit board,
   the signal lines, the first conductive seed layers, the GND line, the second conductive seed layer, and the wiring line layer being formed by a semi-additive method on the insulating layer, and
   the signal line and the GND line being formed such that a distance S between the two signal lines is greater than a distance D between the GND line and one of the two signal lines located closer to the GND line.

2. The differential signal transmission circuit according to claim 1, wherein
   a relationship between the distance S and the distance D satisfies 2D<S.

3. The differential signal transmission circuit according to claim 1, wherein
   the distance D is 5 μm~60 μm.

4. The differential signal transmission circuit according to claim 1, wherein
   the insulating layer is formed with a thickness of 10 μm~30 μm.

5. The differential signal transmission circuit according to claim 1, wherein
   a difference in thickness of the two signal lines is 0.8 μm or less.

6. A method for manufacturing a differential signal transmission circuit, the differential signal transmission circuit being configured by a double-sided flexible printed circuit board and having two signal lines provided in parallel and, on an outer side of the two signal lines, a GND line, formed on one surface of an insulating layer, and having a wiring line layer formed on the other surface of the insulating layer, by a semi-additive method, the method for manufacturing the differential signal transmission circuit comprising:
   forming a seed layer on both surfaces of the insulating layer, the seed layer being conductive;

forming a plating resist pattern on the seed layer, such that a distance S between the two signal lines is greater than a distance D between the signal line and the GND line;

forming a plating layer on the seed layer where the plating resist is not formed above the seed layer, by electrolytic plating; and removing the plating resist and the seed layer below the plating resist.

\* \* \* \* \*